(12) United States Patent
Wicks et al.

(10) Patent No.: US 6,171,116 B1
(45) Date of Patent: Jan. 9, 2001

(54) PIN TERMINAL ALIGNMENT SYSTEM

(75) Inventors: John L. Wicks, Cortland; Raymond A. Nemetz, Warren, both of OH (US)

(73) Assignee: Delphi Technologies, Inc., Troy, MI (US)

( * ) Notice: Under 35 U.S.C. 154(b), the term of this patent shall be extended for 0 days.

(21) Appl. No.: 09/277,012

(22) Filed: Mar. 26, 1999

(51) Int. Cl.[7] .................................................. H01R 1/00
(52) U.S. Cl. ................................................ 439/79; 439/80
(58) Field of Search ........................................ 439/79, 80

(56) References Cited

U.S. PATENT DOCUMENTS

| | | | |
|---|---|---|---|
| 5,468,154 | * 11/1995 | Yip et al. | 439/79 |
| 5,591,036 | * 1/1997 | Doi et al. | 439/79 |
| 5,692,912 | * 12/1997 | Nelson et al. | 439/79 |
| 5,827,076 | * 10/1998 | Chen | 439/79 |
| 5,921,789 | * 7/1999 | Makano et al. | 439/79 |

* cited by examiner

Primary Examiner—T. C. Patel
(74) Attorney, Agent, or Firm—Patrick M. Griffin

(57) ABSTRACT

A pin terminal alignment system which serves to fix pin terminal spacing, provide indexable spacing and provide ease of installation. A pair of alignment bodies, each having a generally planar, elongated shape and preferably formed of plastic, each have a plurality of alignment holes formed therein, wherein each alignment hole is allocated to a respective pin terminal of a header assembly. The system preferably includes an abutting interaction between the alignment bodies and the header assembly which indexably spaces the bodies with respect to the header assembly, as well as with respect to a printed circuit board to the pin terminals connect. The rigidity and locating features provided by the terminal pin alignment system serve to ensure geometrical dimension and tolerance precision of the pins as a whole, and the pin terminals in particular, with respect to both the header assembly and the PCB.

6 Claims, 4 Drawing Sheets

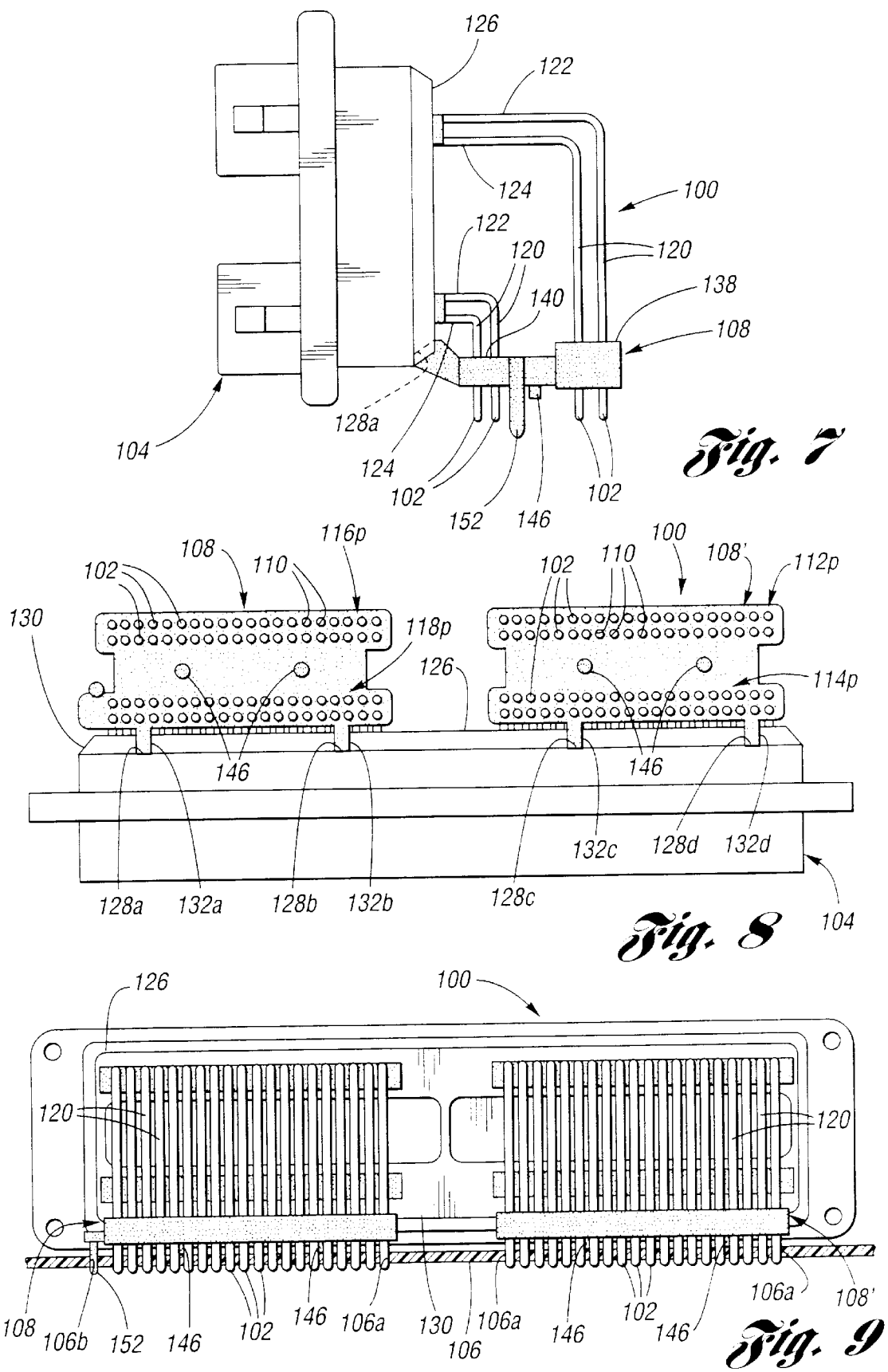

PIN TERMINAL ALIGNMENT SYSTEM

TECHNICAL FIELD

The present invention relates to connection modalities between the pin terminals of a header assembly and a printed circuit board (PCB), and more particularly to pin alignment devices for the pin terminals. Still more particularly, the present invention relates to a rigid pin terminal alignment system which provides precise pin terminal alignment and indexable spacing features.

BACKGROUND OF THE INVENTION

As shown at FIG. 1, a header assembly 10 is used to interconnect between wiring harness connectors and a printed circuit board (PCB) (not shown). The header assembly 10 is typically constructed of aluminum and has four receptacles, arranged as an upper left receptacle 12, a lower left receptacle 14, and upper right receptacle 16 and a lower right receptacle 18. Within each receptacle of the header assembly 10, a plurality of pins 20 are affixed by a plastic inset and epoxy as an upper row and a lower row, wherein the upper and lower rows of pins of each receptacle provide a bank of pins particular to that receptacle. For example, given that the upper and lower rows each have twenty pins, then each receptacle has a bank of forty pins. The receptacles receive, respectively, a corresponding connector of one or more wiring harnesses so as to electrically contact the pins. At the rear side of the header assembly 10, the pins 20 horizontally project to a predetermined bend location respectively for each of the upper and lower rows of each of the receptacles, respectively, whereupon the pins are vertically oriented and terminate as pin terminals 22 at a common plane.

Problematically, the pin terminals 22 of the pins 20 are distantly separated from the header assembly 10, resulting in the precise alignment of the pin terminals being subject to misalignment with the application thereto of lateral forces. However, in order for the pin terminals 22 to properly interface with corresponding connection locations of a PCB, it is necessary to restrain the pin terminals from being free to move relative to one another so that pin terminal alignment will remain precise.

In the prior art, it is known to utilize a perforated mylar sheet 24 to restrain movement of the pin terminals, wherein each pin terminal passes through a respective perforation 26. In this regard, a first mylar sheet is used to alignably interface with the two banks of pin terminals associated with the upper and lower left receptacles 12, 14, and a second mylar sheet is used to alignably interface with the two banks of pin terminals associated with each of the upper and lower right receptacles 16, 18.

While the mylar sheets can aid to restrain the pin terminals from relatively moving, the inherent flexibility of a mylar sheet cannot prevent an untoward force from misaligning the pin terminals, whether individually, collectively, or as a bank. Further, the need to precisely align the perforations with each respective pin terminal prior to placement of the mylar sheets onto the pin terminals is an undesirably critical assembly step. Further, mylar sheets cannot serve to space the pins with respect to the header assembly and to the PCB. Yet another problem of mylar sheet is that it can slip up the pins or down and off the pins, since it has no ability to indexably space itself relative to the header assembly. Still further, mylar sheets become increasingly incapable of serving their intended pin spacing maintenance function in high pin density applications in which the spacing between the pins is very small.

Accordingly, what remains needed in the art is a pin terminal alignment article which serves to fix pin terminal spacing, provide indexable spacing and provide ease of installation.

SUMMARY OF THE INVENTION

The present invention is a pin terminal alignment system which serves to fix pin terminal spacing, provide indexable spacing and provide ease of installation.

The pin terminal alignment system according to the present invention includes a pair of alignment bodies, each having a generally planar, elongated shape and preferably formed of plastic. Each alignment body has a plurality of alignment holes formed therein, each alignment hole being allocated to a respective pin terminal of a header assembly. The system preferably includes an abutting interaction between the alignment bodies and the header assembly which indexably spaces the bodies with respect to the header assembly.

At a top side of each alignment body, the alignment holes are each provided with a guide cone for providing guided pin insertion into the alignment holes without risk of pin distortion, even where the insertion operation is performed manually. A pair of header index spacers are provided on both of the alignment bodies which indexably interface with the header assembly to provide precise location of the alignment bodies with respect to the header assembly, and as an inherent consequence thereof, precise geometrical dimension and tolerance of the pin terminals with respect to the header assembly and the PCB to which the terminals pins are to be electrically connected. A PCB index leg on one of the alignment bodies provides an indexable interface with a PCB so as to ensure a proper interfit between parts. Standoffs are provided on the bottom side of both of the alignment bodies to ensure a predetermined minimum spacing between the PCB and the alignment bodies, thereby preventing the alignment bodies from resting upon solder joints of the PCB and ensuring prevention of entrapped moisture therebetween.

The rigidity and locating features provided by the terminal pin alignment system serve to ensure geometrical dimension and tolerance precision of the pins as a whole, and the pin terminals in particular, with respect to both the header assembly and the PCB.

Accordingly, it is an object of the present invention to provide a pin terminal alignment system which rigidly aligns the pin terminals in a predetermined arrangement prior to connection to a PCB.

It is an additional object of the present invention to provide a pin terminal alignment system as aforementioned, further featuring rigid alignment bodies having alignment holes for retaining the pin terminals in a predetermined pattern.

It is another object of the present invention to provide a pin terminal alignment system as aforementioned, further featuring guide cones at each alignment hole for guiding initial entry of each pin terminal into its respective alignment hole.

It is an additional object of the present invention to provide a pin terminal alignment system as aforementioned, further featuring indexable location features with respect to the alignment bodies and the header assembly and selectively with respect to the PCB.

It is yet another object of the present invention to provide a pin terminal alignment article as aforementioned, further featuring stand-off features with respect to the PCB.

These, and additional objects, advantages, features and benefits of the present invention will become apparent from the following specification.

BRIEF DESCRIPTION OF THE DRAWINGS

FIG. 7 is an end view of the terminal pin alignment system, showing the first alignment body operatively interfaced with the header assembly as in FIG. 2.

FIG. 8 is a bottom plan view of the pin terminal alignment system, showing the first and second alignment bodies operatively interfaced with the header assembly.

FIG. 9 is a rear view of the pin terminal alignment system, showing the first and second alignment bodies operatively interfaced with the header assembly and a PCB.

DESCRIPTION OF THE PREFERRED EMBODIMENT

Figure 1:
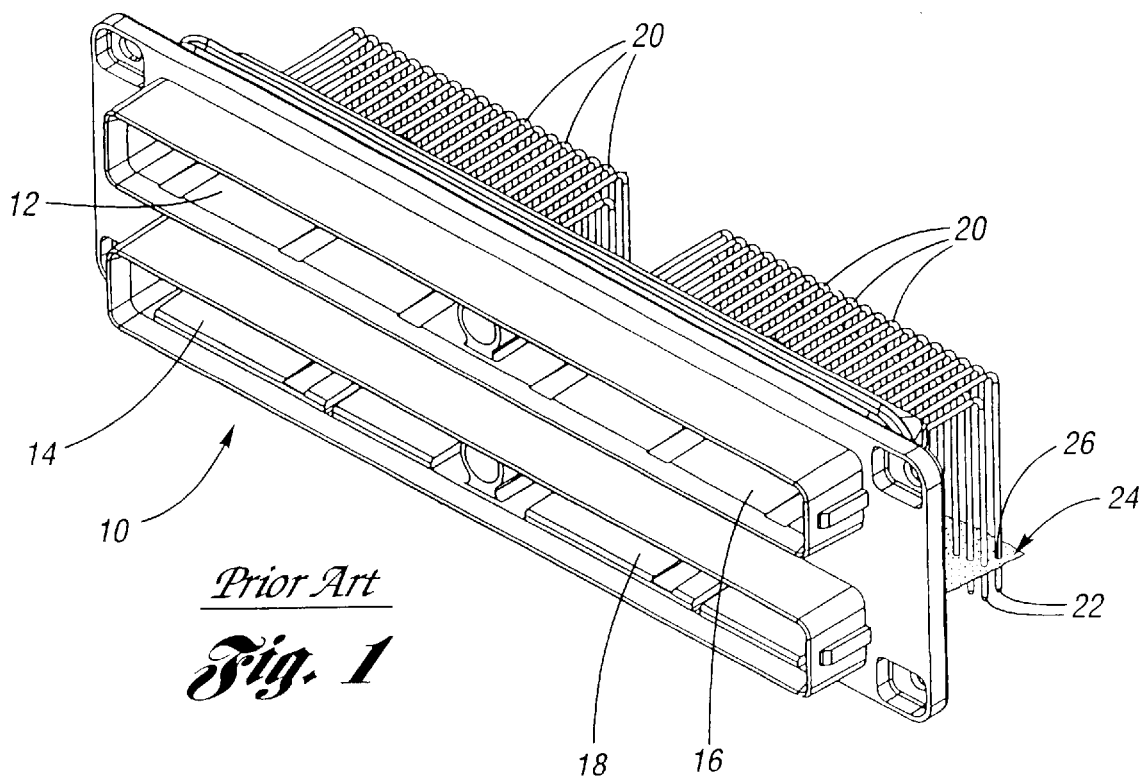
FIG. 1 is a perspective view of a prior art header assembly, showing a portion of its associated pin terminals, and a prior art mylar sheet for aligning the pin terminals thereof.
Figure 2:
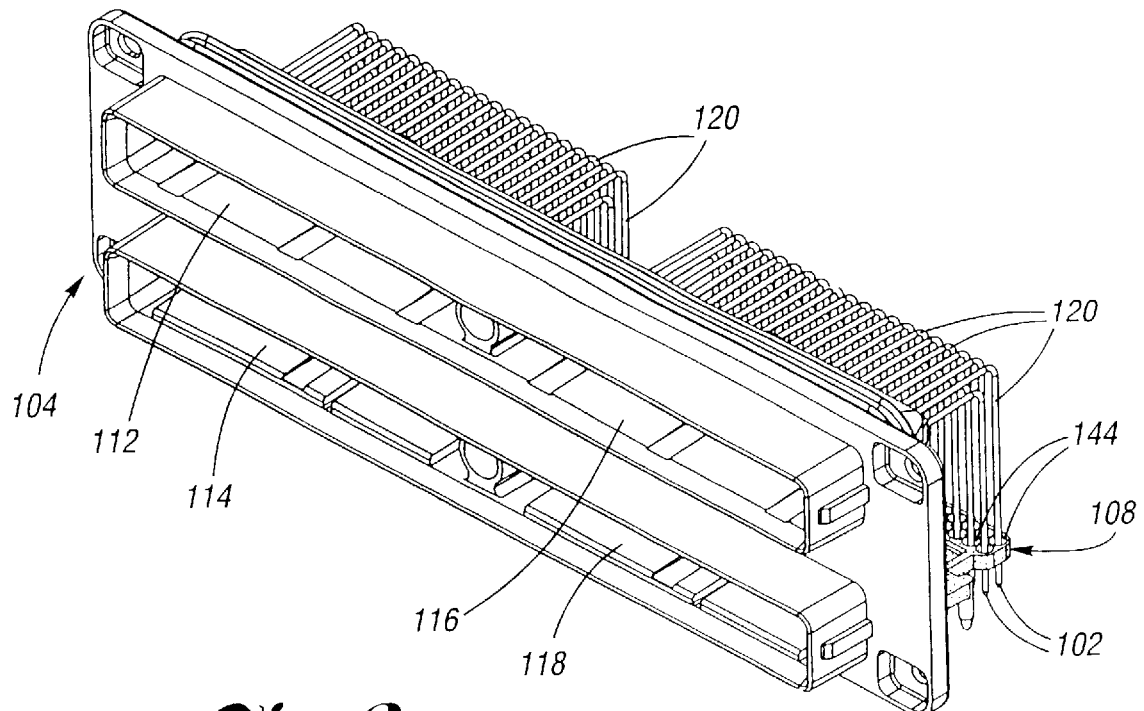
FIG. 2 is a perspective view of the terminal pin alignment system according to the present invention, wherein a portion of the pin terminals of a header assembly according to the present invention is shown alignably interfaced with a first alignment body according to the present invention.

Referring now to the Drawings, FIGS. 2 through 9 generally depict various aspects the pin terminal alignment system 100 according to the present invention. As can be seen by simultaneous reference to FIGS. 2, 7, 8 and 9, the pin terminal alignment system 100 provides precise geometrical dimension and tolerance precision of the pin terminals 102 of a header assembly 104 with respect thereto and to a PCB 106. In this regard, rigid first and second alignment bodies 108, 108', preferably composed of plastic, have a plurality of alignment holes 110 through which the pin terminals 102 alignably pass, the predetermined precise arrangement of the pin terminals being maintained by the pattern of the alignment holes of the first and second alignment bodies. As can be further operationally discerned from FIGS. 7 and 9, the pin terminals 102 project outwardly from the alignment bodies 108, 108' so as to provide adequate exposure for connection to the PCB 106, such as for example by entry into pin receiving holes 106a of the PCB and connection thereto by solder (see FIG. 9).

The header assembly 104 according to the present invention, like the conventional header assembly 10 shown at FIG. 1, has an upper left receptacle 112, a lower left receptacle 114, an upper right receptacle 116 and a lower right receptacle 118. As in the header assembly 10 depicted at FIG. 1, within each receptacle of the header assembly 104, a plurality of pins 120 are affixed by a plastic inset and epoxy as an upper row 122 and a lower row 124 (see FIG. 7), wherein the upper and lower rows of pins of each receptacle provide a bank of terminal pins particular to that receptacle (see FIG. 8). Thus, the upper left receptacle 112 has uniquely associated with it a first terminal pin bank 112p, the lower left receptacle 114 has uniquely associated with it a second terminal pin bank 114p, the upper right receptacle 116 has uniquely associated with it a third terminal pin bank 116p, and the lower right receptacle 118 has uniquely associated with it a fourth terminal pin bank 118p (see FIG. 8). The receptacles 112, 114, 116, 118 operate conventionally with respect to one or more wiring harnesses as described with respect to FIG. 1. At the rear side 126 of the header assembly 104, the pins 120 horizontally project (that is, are oriented normal to the rear side 126) to a predetermined bend location respectively for each of the upper and lower rows of each of the receptacles, respectively, whereupon the pins 120 are vertically oriented (that is, are oriented parallel to the rear side 126) and terminate as the aforementioned pin terminals 102 at a common plane.

Unique to the header assembly 104 according to the present invention, are a plurality of indexing slots: a first indexing slot 128a, a second indexing slot 128b, a third indexing slot 128c, and a fourth indexing slot, each formed at a lower frame portion 130 of the rear side 126 of the header assembly, adjacent the lower left and lower right receptacles 114, 118. The first alignment body 108 has first and second header index spacers 132a, 132b which seat, respectively, into the first and second indexing slots 128a, 128b in the manner depicted at FIGS. 7 and 8. The second alignment body 108' has third and fourth header index spacers 132c, 132d which seat, respectively, into the third and fourth indexing slots 128c, 128d, again in the manner depicted at FIGS. 7 and 8.

The first, second, third and fourth header index spacers 132a, 132b, 132c, 132d are dimensioned to locate each of the alignment holes 110 exactly in alignment with its respective pin terminal 102. Further, the minimum spacing between the rear side 126 and the first and second bodies 108, 108' is fixed thereby. Further, the seating prevents a lateral force (directed to the left or right of FIG. 9 parallel to the rear side 126) from misaligning the terminal pins. Indexing of the first and second alignment bodies 108, 108' is provided by the location and relative spacing of the first and second header index spacers 132a, 132b and their respective first and second indexing slots 128a, 128b being different from that of the third and fourth header index spacers 123c, 132d and their respective third and fourth indexing slots 128c, 128d, as best depicted at FIG. 8.

Figure 3:
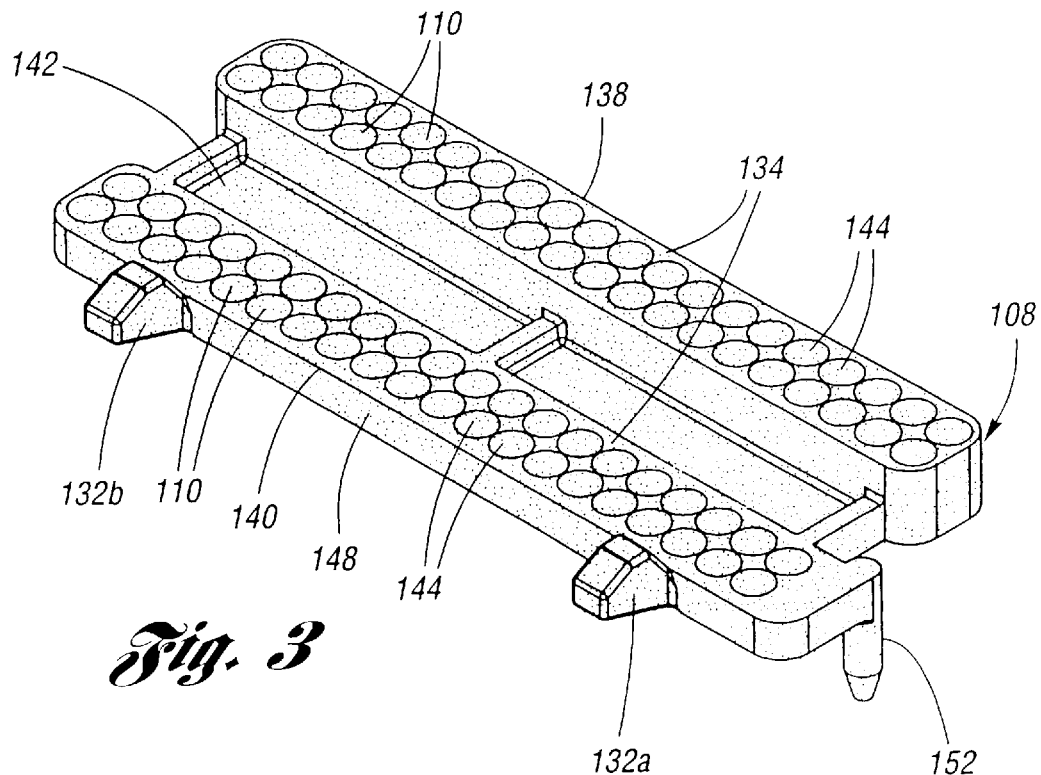
FIG. 3 is a top perspective view of the first alignment body according to the present invention.
Figure 4:
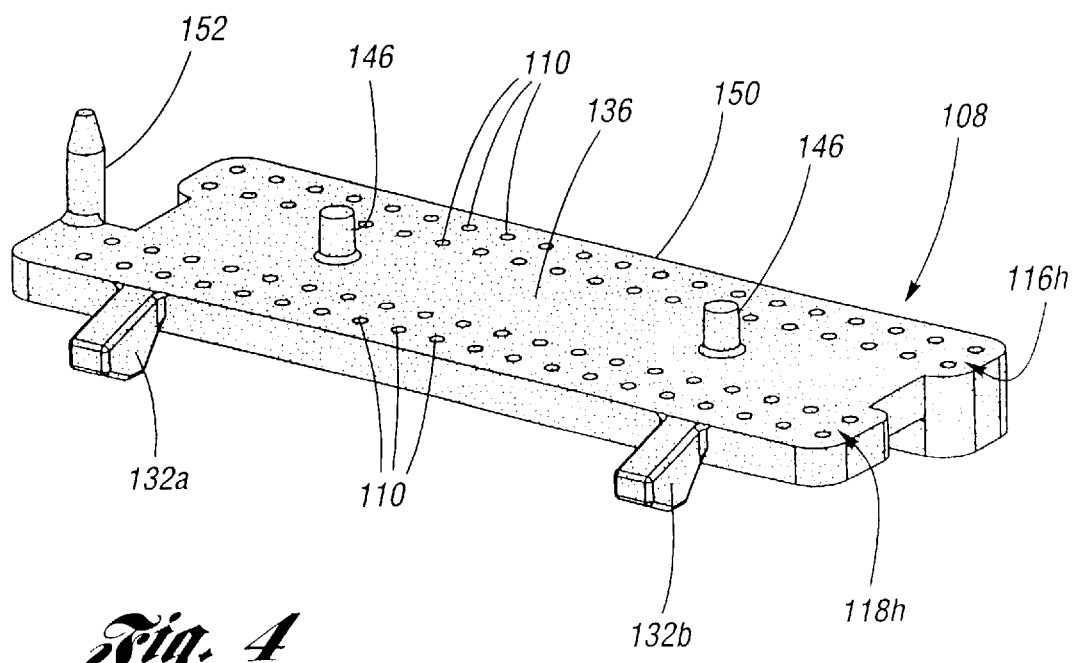
FIG. 4 is a bottom perspective view of the first alignment body of FIG. 3.
Figure 5:
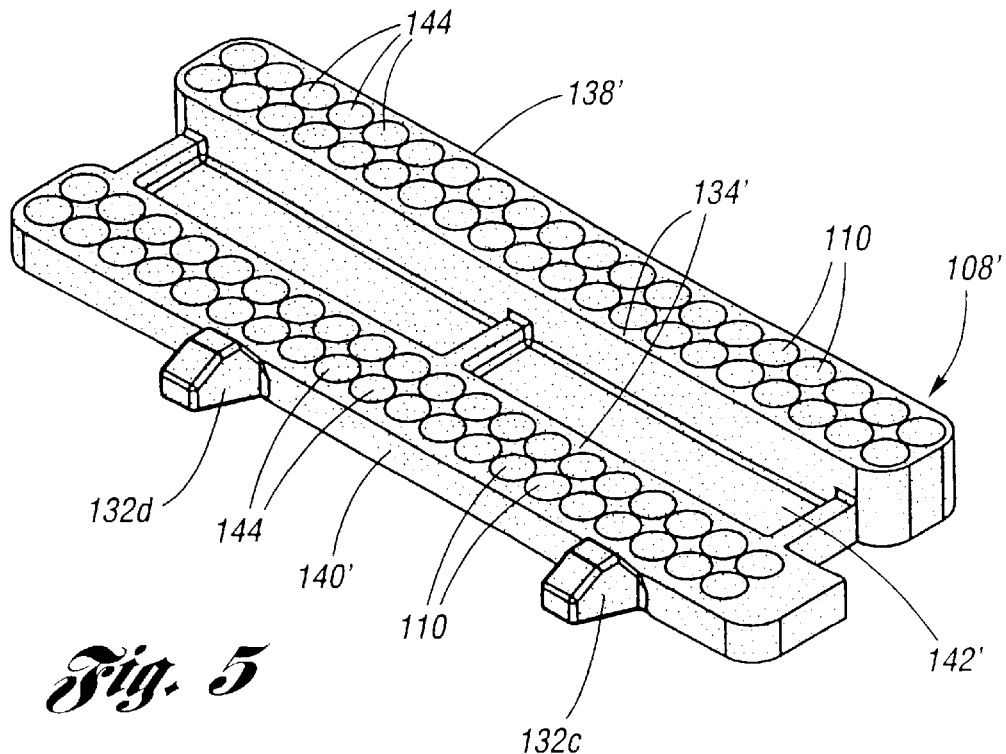
FIG. 5 is a top perspective view of a second alignment body according to the present invention.
Figure 6:
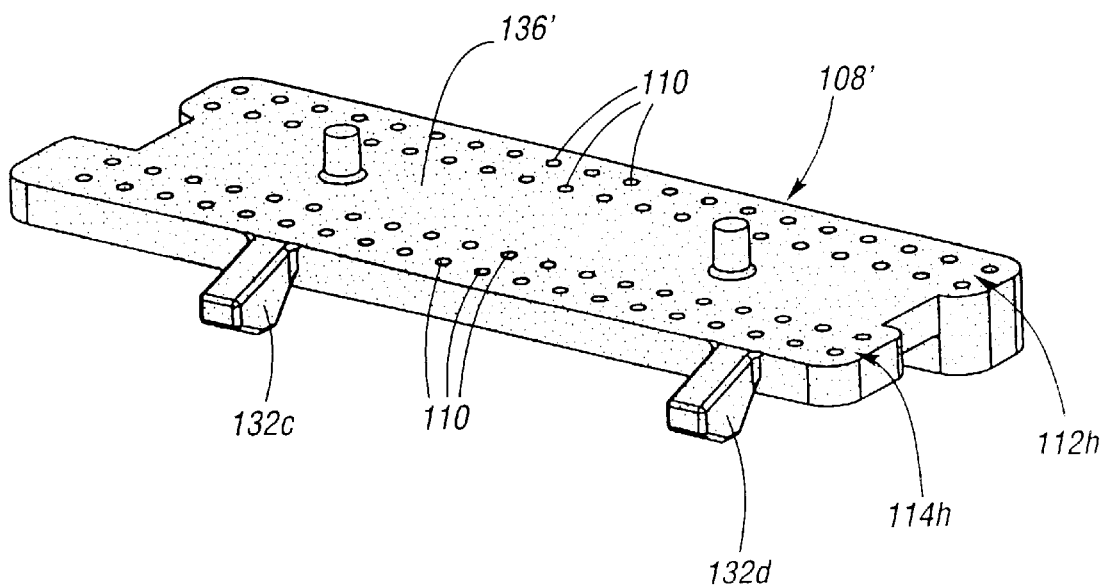
FIG. 6 is a bottom perspective view of the second alignment body of FIG. 5.

Turning attention now to FIGS. 3 through 6, the configuration of first and second alignment bodies 108, 108' will now be detailed, wherein FIGS. 3 and 4 depict the first alignment body 108, and FIGS. 5 and 6 depict the second alignment body 108'.

The first alignment body 108 has a top side 134 and an opposite bottom side 136, wherein the alignment holes 110 pass normally between the top and bottom sides. The first alignment body 108 is elongated and characterized by a forward body member 138, a rearward body member 140, and a medial body member 142 integrally formed therewith. The alignment holes 110 formed in the forward body member 138 are arranged in an alignment hole bank 118h corresponding to the arrangement of the fourth pin terminal bank 118p associated with the lower right receptacle 118 (see FIGS. 7 and 8). The alignment holes 110 formed in the rearward body member 140 are arranged in an alignment hole bank 116h corresponding to the arrangement of the third pin terminal bank 116p associated with the upper right receptacle 116.

The alignment holes 110 at the top side 136 are each provided with a guide cone 144 having increasing cross-section with increasing proximity to the top side. It is preferred for the maximum cross-section of each guide cone 144 (at the top side 134) to be approximately three times the cross-section of the alignment holes 110 (at the bottom side 136), wherein the depth of each cone 144 is approximately equal to the thickness of the forward body member 138, wherein it is preferred for the rearward body member 140 to be approximately twice as thick as the forward body member. The guide cones 144 serve to guidably engage each pin terminal 102 into its respective alignment hole 110, particularly at initial entry.

The bottom side 136 is preferably flat, and is provided with a pair mutually spaced apart stand-offs 146. The stand-offs 146, as can be understood from FIG. 7, extend as studs perpendicularly from the bottom side 136 a distance that is predetermined to be less than the length of protrusion of the pin terminals 102 at the bottom side. The stand-offs 146 serve to abut the PCB 106 (per FIG. 9) so as to separate the first alignment body 108 from the PCB sufficiently so that moisture will not be trapped therebetween, and further to ensure that the first alignment body will not abut solder connections of the PCB.

The forward edge 148 of the first alignment body 108 is provided with the aforementioned first and second header index spacers 132a, 132b, and the rearward edge 150 is generally flat.

The left end of the bottom side 136 of the first alignment body 108 is provided with a normally projecting PCB index leg 152 which extends longer than the stand-offs 146 and seats into a predetermined index seat 106b (such as for example an index hole) formed in the PCB 106 to thereby index the PCB with respect to the first alignment body 108 and thereby ensure that the correct PCB is aligned with the pin terminals 102.

The second alignment body 108' has a top side 134' and an opposite bottom side 136', wherein the alignment holes 110 pass normally between the top and bottom sides. The second alignment body 108' is elongated and characterized by a forward body member 138', a rearward body member 140', and a medial body member 142' integrally formed therewith. The alignment holes 110 formed in the forward body member 138' are arranged in an alignment hole bank 114h corresponding to the arrangement of the second pin terminal bank 114p associated with the lower left receptacle 114 (see FIG. 8). The alignment holes 110 formed in the rearward body member 140' are arranged in an alignment hole bank 112h corresponding to the arrangement of the first pin terminal bank 112p associated with the upper left receptacle 112.

Geometrically identical with the first alignment body 108, the alignment holes 110 at the top side 134' are each provided with a guide cone 144 having increasing cross-section with increasing proximity to the top side. Again, it is preferred for the rearward body member 140' to be approximately twice as thick as the forward body member 138'. The guide cones 144 of the second alignment body 108' again serve to guidably engage each pin terminal 102 into its respective alignment hole 110, particularly at initial entry. The bottom side 136' of the second alignment body 108' is preferably flat, and is provided with a pair mutually spaced apart stand-offs 146, identical structurally and operatively as recounted with respect to the first alignment body 108.

The forward edge 148' of the second alignment body 108' is provided with the aforementioned third and fourth header index spacers 132c, 132d, and the rearward edge 150' is, again, generally flat.

In operation, the first or the second alignment body 108, 108' is brought up to its respective banks of pin terminals, wherein the guide cones 144 face the pin terminals 102. The selected alignment body is then moved relative to the header assembly 104 so that the pin terminals enter into the cones, one pin terminal per alignment hole. The alignment body is then slid up the pin terminals until the header index spacers seat on their respective indexing slots. The other of the first and second alignment bodies is then placed onto its respective banks of pin terminals in the manner aforesaid, wherein these processes may be performed mechanically or manually. Lastly, a preselected PCB 106 is brought up to the banks of pin terminals, and, with the PCB index leg engaged into its index seat 106b on the PCB (thereby assuring correct parts assembly) the pin terminals are inserted into respective pin receiving holes 106a of the PCB and then soldered in place (see FIG. 9).

It is to be understood that the terminal pin alignment system according to the present invention is described here merely be way of preferred example, and is usable with any header assembly and any PCB, within the scope defined by the appended claims.

To those skilled in the art to which this invention appertains, the above described preferred embodiments may be subject to change or modification. Such change or modification can be carried out without departing from the scope of the invention, which is intended to be limited only by the scope of the appended claims.

What is claimed is:

1. A pin terminal alignment system, comprising:
  a header assembly having first, second, third and fourth receptacles and a rear side, each of the first, second, third and fourth receptacles having a respective plurality of pins forming a bank of pins associated uniquely therewith, each bank of pins extending initially normally from said rear side and thereafter selectively bending so as to be oriented parallel to said rear side, each bank of pins terminating in a respective bank of pin terminals;
  a first plurality of indexing slots formed at said rear side, each slot of said first plurality of indexing slots being located according to a first spatial relationship with respect to said rear side;
  a second plurality of indexing slots formed at said rear side, each slot of said second plurality of indexing slots being located according to a second spatial relationship with respect to said rear side, wherein said first spatial relationship is different from said second spatial relationship;
  a first rigid alignment body having a top side and an opposite bottom side, said first alignment body having a first plurality of alignment holes formed therein passing from said top side to said bottom side for receiving therethrough the banks of pin terminals associated with the first and second receptacles;
  a second rigid alignment body having a top side and an opposite bottom side, said second alignment body having a second plurality of alignment holes formed therein passing from said top side to said bottom side for receiving therethrough the banks of pin terminals associated with the third and fourth receptacles;
  a first plurality of index spacers connected with said first alignment body for seatably interfacing with the first plurality of indexing slots to thereby provide a predetermined separation between said first alignment body and the header assembly and a first indexing relationship unique to the first alignment body and the header assembly; and a second plurality of index spacers connected with said second alignment body for seatably interfacing with the second plurality of indexing slots to thereby provide the predetermined separation between said second alignment body and the header assembly and a second indexing relationship unique to the second alignment body and the header assembly.

2. The pin terminal alignment system of claim 1, further comprising a cone formed in each said alignment hole at a respective top side of said first and second alignment bodies, each cone increasing in cross-section with increasing proximity to the respective top side.

3. The pin terminal alignment system of claim 2, wherein said first alignment body comprises a first forward body member and a first rearward body member connected thereto, wherein a first bank of alignment holes of the first plurality of alignment holes is formed in the first forward body member and a second bank of alignment holes of the first plurality of alignment holes is formed in the first rearward body member; and wherein said second alignment body comprises a second forward body member and a second rearward body member connected thereto, wherein a third bank of alignment holes of the second plurality of alignment holes is formed in the second forward body member and a fourth bank of alignment holes of the second plurality of alignment holes is formed in the second rearward body member.

4. The pin terminal alignment system of claim 3, wherein said first rearward body member is substantially twice as thick as said first forward body member, wherein said first plurality of index spacers are connected with said first forward body member, and wherein said bottom side thereof is substantially flat; and wherein said second rearward body member is substantially twice as thick as said second forward body member, wherein said second plurality of index spacers are connected with said second forward body member, and wherein said bottom side thereof is substantially flat.

5. The pin terminal alignment system of claim 4, further comprising a printed circuit board having a plurality of pin receiving holes for receiving the bank of pin terminals, respectively, of each of the first, second, third and fourth receptacles; said first and second alignment bodies further comprising stand-off means located at said bottom side respectively thereof for providing an abutment which defines a minimum predetermined space between the printed circuit board and said bottom side of each of said first and second alignment bodies, respectively.

6. The pin terminal alignment system of claim 5, wherein said printed circuit board further has an index seat; wherein said first alignment body further comprises an index leg for indexably interfacing with said index seat.

* * * * *